United States Patent [19]

Frankeny

[11] Patent Number: 5,790,380
[45] Date of Patent: Aug. 4, 1998

[54] METHOD FOR FABRICATING A MULTIPLE CHIP MODULE USING ORTHOGONAL REORIENTATION OF CONNECTION PLANES

[75] Inventor: Richard Francis Frankeny, Elgin, Tex.

[73] Assignee: International Business Machines Corporation, Armonk, N.Y.

[21] Appl. No.: 573,045

[22] Filed: Dec. 15, 1995

[51] Int. Cl.$^6$ .............................. H05K 7/02; H05K 1/11; H05K 5/02; H01L 23/12

[52] U.S. Cl. ............. 361/735; 257/686; 257/777; 361/730; 361/733; 361/790; 361/803

[58] Field of Search ................. 174/254, 52.1, 174/52.4; 257/730, 738, 723, 724, 685, 686, 678, 673, 692, 696, 777, 778; 361/729, 749, 730, 733, 735, 744, 790, 803, 820; 439/67, 77, 68, 69, 70, 83

[56] References Cited

U.S. PATENT DOCUMENTS

| | | | |
|---|---|---|---|
| 3,065,384 | 11/1962 | Sprude | 361/730 |
| 3,070,729 | 12/1962 | Heidler | 361/735 |
| 3,105,869 | 10/1963 | Branch et al. . | |
| 3,113,248 | 12/1963 | Friedman | 361/735 |
| 3,139,559 | 6/1964 | Heidler | 361/730 |
| 3,141,999 | 7/1964 | Schneider | 361/730 |
| 4,495,546 | 1/1985 | Nakamura et al. . | |
| 4,833,568 | 5/1989 | Berhold | 361/735 |
| 4,862,249 | 8/1989 | Carlson | 257/686 |
| 5,137,461 | 8/1992 | Bindra et al. . | |
| 5,229,916 | 7/1993 | Frankeny et al. . | |
| 5,313,416 | 5/1994 | Kimura . | |
| 5,448,511 | 9/1995 | Paurus et al. . | |

FOREIGN PATENT DOCUMENTS

| | | |
|---|---|---|
| 3931238A1 | 11/1992 | Germany . |
| 59-194460 | 11/1984 | Japan ................. 257/673 |

OTHER PUBLICATIONS

IBM TDB, Double-Sided, Replaceable, Dendrite-Plated Interposer for Connector Applications, vol. 37, No. 10, Oct. 1994, pp. 35–36.

IBM TDB, Interposer for Direct Chip Attach or Surface Mount Array Devices, vol. 36, No. 07, Jul. 1993, pp. 137–138.

Electro-Technology, Mar. 1962, Culver City, California, "Microelectronic-Interconnection Design", Branch et al, pp. 76–79.

T & B Engineered, Jan. 1961, "POS–E–KON Printed Board Connectors".

"Elektronische Hybrid-Systeme" by W.A. Brotherton, K Street, vol. 14 No. 9 pp. 28–30, Jan. 1984.

Primary Examiner—Donald Sparks
Attorney, Agent, or Firm—Casimer K. Salys

[57] ABSTRACT

A multiple chip module architecture capable of forming structures having selectable aspect ratios which themselves form the basis for higher levels of integration in analogous manner. The modular architecture uses a flexible interconnect of patterned copper on polymer to successively reorient the connection plane between successive levels, permitting the selective stacking of module levels to create the desired aspect ratio of the multiple chip module. Interconnection between levels may be accomplished by solder reflow, direct dendritic bonding, or connection through a dendritic interposer.

4 Claims, 4 Drawing Sheets

METHOD FOR FABRICATING A MULTIPLE CHIP MODULE USING ORTHOGONAL REORIENTATION OF CONNECTION PLANES

FIELD OF THE INVENTION

The present invention relates generally to the packaging of integrated circuit chips. More particularly, the invention is directed to multiple chip modules of high density and controlled profile.

BACKGROUND OF THE INVENTION

Personal computers, workstations and similar digital data processing equipment continue to increase in functional capability at an exceptional rate. Even through the electronic devices which create the functions have continued to shrink, the number of integrated circuit chips on the boards which form the basis for such products continue to increase both in number and interconnect complexity. Furthermore, the users of the systems continue to expect decreases in size and weight, a particularly poignant example being portable personal computers. As a consequence of the trend, the manufacturers of such equipment are moving in the direction of multiple chip modules, which modules provide a high functional density in a small physical volume. Unfortunately, most presently proposed multiple chip module designs are complex, expensive and economically unserviceable.

The need for high packaging density is particularly acute in the area of memory devices. With the expanded use of complex operating system, elaborate application programs, and high pixel and color resolution video displays, memory usage, typically DRAM devices, has increased dramatically. These trends have led to the development of memory packaging techniques beyond the conventional use of SIMM connectors. The SIMM technology provides computer users with reasonably priced, fairly compact and readily serviceable or interchangeable packaging for memory devices. Unfortunately, the densities of SIMM board memory devices and the profiles of SIMM connected boards will no longer satisfy the volume and profile demands of new computer systems. What is needed is a multiple chip module technology which permits the creation of modules at a low cost, with a high chip density, provides resources for chip cooling, and is interconnected to allow easy replacement at the computer system board level.

SUMMARY OF THE INVENTION

The present invention solves the problems of the prior art by providing a multiple chip package, comprising multiple first level modules, the first level modules enclosing a chip within a first support means for electrically routing chip input/output connections from a first plane, defined by pads on a chip, to a second plane, orthogonal to the first plane, first contacts of the first level modules distributed in the second plane on the first support means, means for forming second level modules, the second level modules enclosing multiple first level modules within a second support means for routing connections with the first contacts of multiple first level modules in the second plane to positions coplanar with the first plane, and second contacts of the second level module situated coplanar with the first plane on the second support means.

In another form, the invention relates to a method for fabricating a multiple chip module, comprising the steps of enclosing multiple first level modules within a second support media, the first level modules characterized in their having a first support media enclosing a chip to electrically route chip input/output connections from a first plane, defined by pads on the chip, to a second plane, orthogonal to the first plane, and first contacts distributed in the second plane on the first support media; bending the second support media to route connections with the first contacts of the multiple first level modules in the second plane to positions coplanar with the first plane; and orienting second contacts on the second support media of the second level module to be coplanar with the first plane.

In one particularized practice of the invention, integrated circuit chips are bonded to a metallic heat spreader and electrically connected on the opposite surface to a flexible polymer supporting substrate which is wrapped around the edge of the chip and onto the metal heat spreader. Plated copper interconnects on the polymer extend from the plane defined by the pads of the integrated circuit chip to a perpendicular plane aligned with the edge of the chip.

The first level modules are then connected through contacts on the polymer into second level modules. The number of first level modules combined into a second level module is dictated by the relative aspect ratio sought of the second level module. If the second module is to be relatively thin, only a few chips are stacked. If a high aspect ratio second level module is desired, numerous first level modules are stacked.

In one practice of the invention, the second level module is composed of multiple first level modules connected through contacts extending along the thin edge of the first level modules, through a printed circuit board substrate, and to conductors on a second level module supporting layer of flexible polymer. Contacts formed on the polymer are oriented coplanar with the pads on the chips of the first level modules by bending the polymer and attached copper interconnect. Multiple second level modules are further heirarchically interconnectable through successive reorientations and connections of contacts to create multiple chip modules of selectable size and shape.

In one form of the invention, second and higher level module structures are connected through compression to supporting printed circuit board base layers using dendrites on selected contacts. Connections using dendrites may be accomplished directly between contacts, or may be accomplished through the use of a flexible interposer of dendritically fortified vias and low melting point solder contacts on the mating polymer and printed circuit board structures.

These and other features of the invention will be more clearly understood and appreciated upon considering the detailed embodiment described hereinafter.

DESCRIPTION OF THE PREFERRED EMBODIMENT

Figure 1:
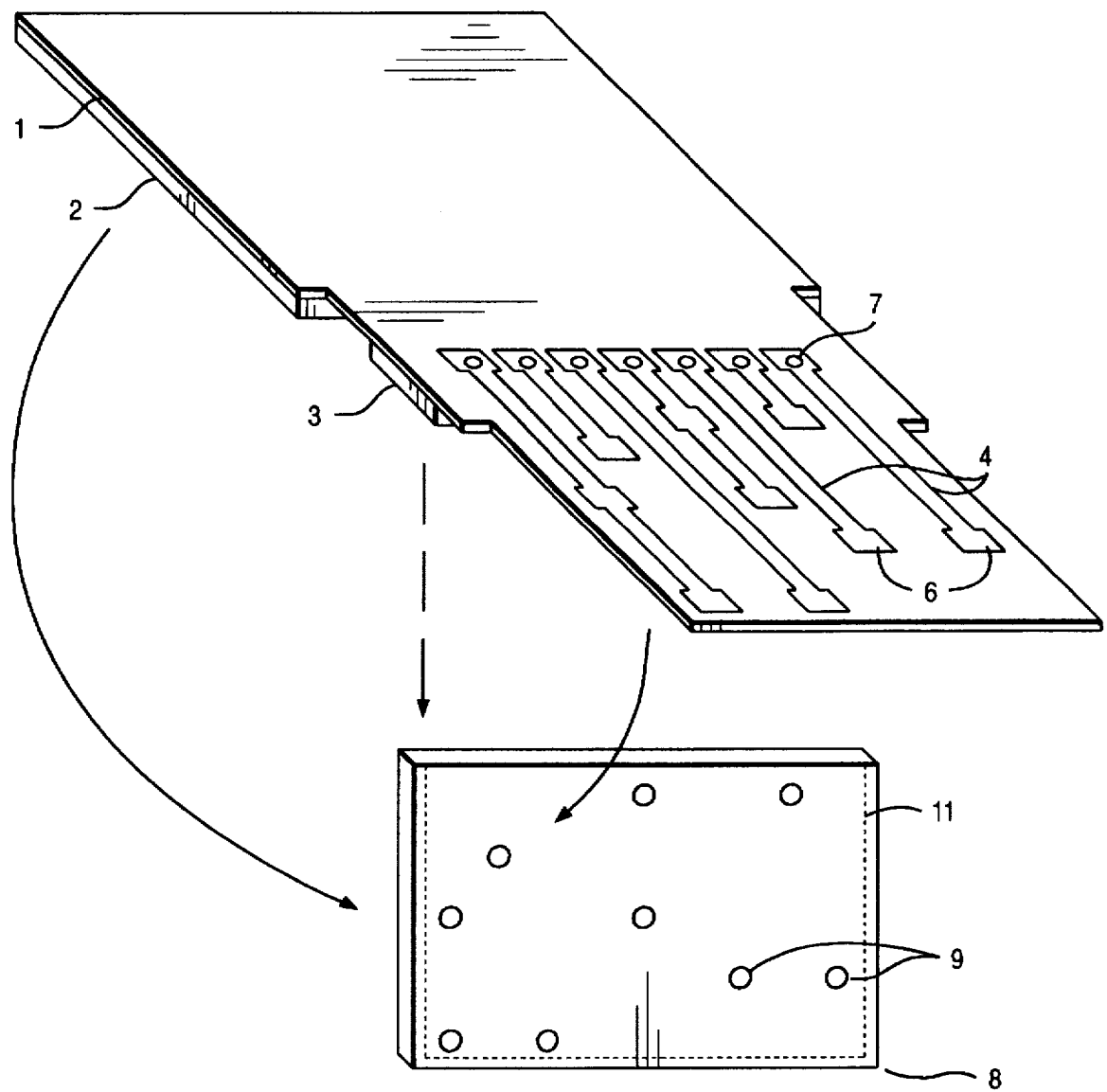
FIG. 1 schematically depicts the creation of a first level module as known in the prior art.

FIG. 1 schematically illustrates the formation of the level 1 module preferably used in the practice of the present invention. The details of the design are described in U.S. Pat. No. 5,229,916, the subject matter of which is incorporated herein by reference. As shown in FIG. 1, a flexible polymer supporting substrate 1 has bonded thereto a heat spreading metallic layer 2 and a stiffening metal or the like layer 3. Copper interconnect conductors 4 are plated onto polymer 1, the polymer 1 preferably being a thin, low dielectric constant polyimide. Plated through vias are formed at pads 6 of polymer 1, thereby electrically projecting through polymer 1 at the selected locations. Contacts 7 of solder or the like are formed onto conductors 4 along a line defined by stiffener 3.

The support structure formed by polymer 1, heat spreader 2, and stiffener 3 is then wrapped around and bonded to integrated circuit chip 8 so that stiffener 3 aligns with the edge of chip 8. The pattern of vias through polymer 1 at pads 6 align with pads 9 on chip 8. Heat spreader 2 contacts the back of chip 8. Once positioned and bonded to integrated circuit chip 8, the polymer support structure and accompanying wiring pattern covers chip 8 as generally shown by dashed line 11. A cross section of the concluding structure is depicted in FIG. 2.

Figure 2:
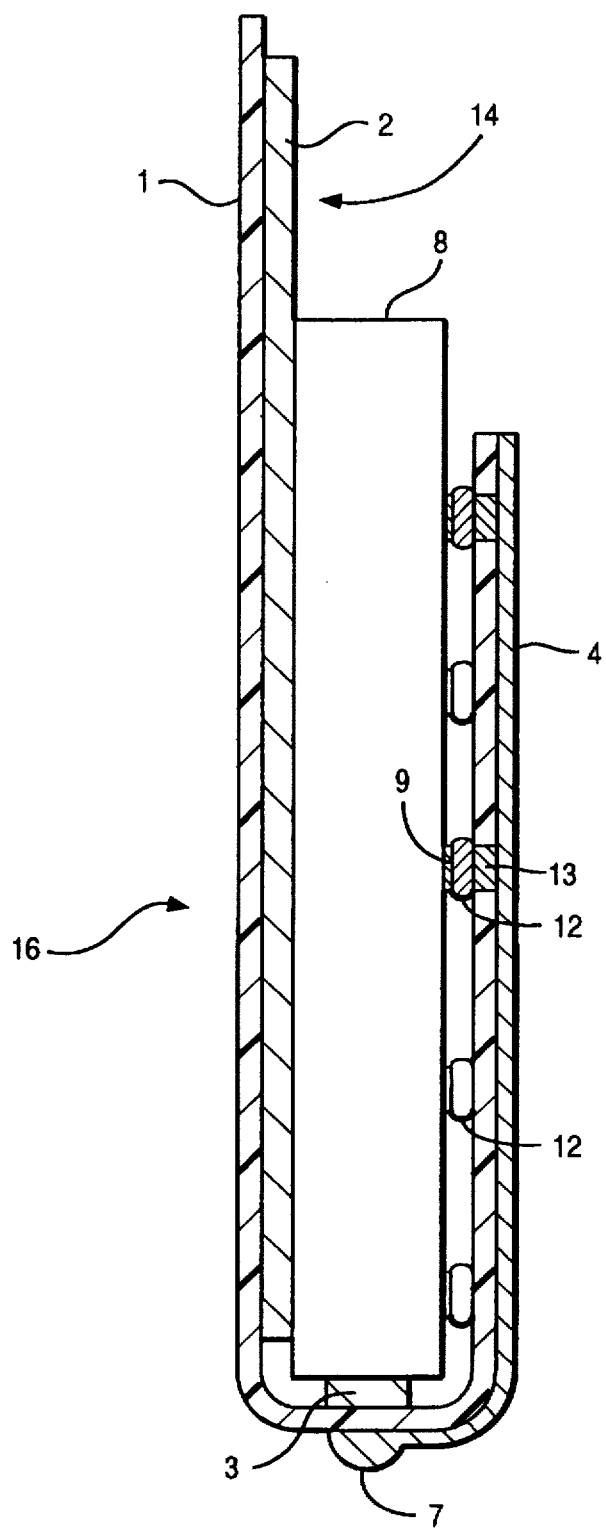
FIG. 2 depicts by schematic cross section a first level module created in the practice of the prior art of FIG. 1.

The reference numerals used in the cross section of FIG. 2 match those of FIG. 1 for like elements. Solder deposits 12 are used on vias 13 to make the electrical connection between plated interconnect copper 4 and pads 9 of chip 8. Note that heat spreader metal 2 extends beyond the surface of integrated circuit chip 8 in region 14. This arrangement provides heat dissipation capability where necessary given that chip 8 is relatively enclosed within a low thermal conductivity polymer. Stiffener 3 provides chip edge support and planarity for contacts 7 extending along the edge of chip 8.

The bend in polymer 1 and copper 4 reorients the interconnect plane from that defined by chip pads 9 to a plane orthogonal thereto. Note that contacts 7 lie in the plane along the narrow edge of first level module 16. The prior art contemplates the direct insertion of the modules in FIG. 2 into sockets mounted on printed circuit boards, so that contacts 7 could be bonded directly by solder reflow to wiring pads on the printed circuit board. See U.S. Pat. No. 5,229,916.

The present invention recognizes and utilizes the benefits of the asymmetry exhibited by first level module 16 in FIG. 2 to selectively create high or low aspect ratio second level modules. As noted earlier, the shrinking dimensions of digital processing systems have clearly established the need for low aspect ratio multiple chip modules.

Figure 3:
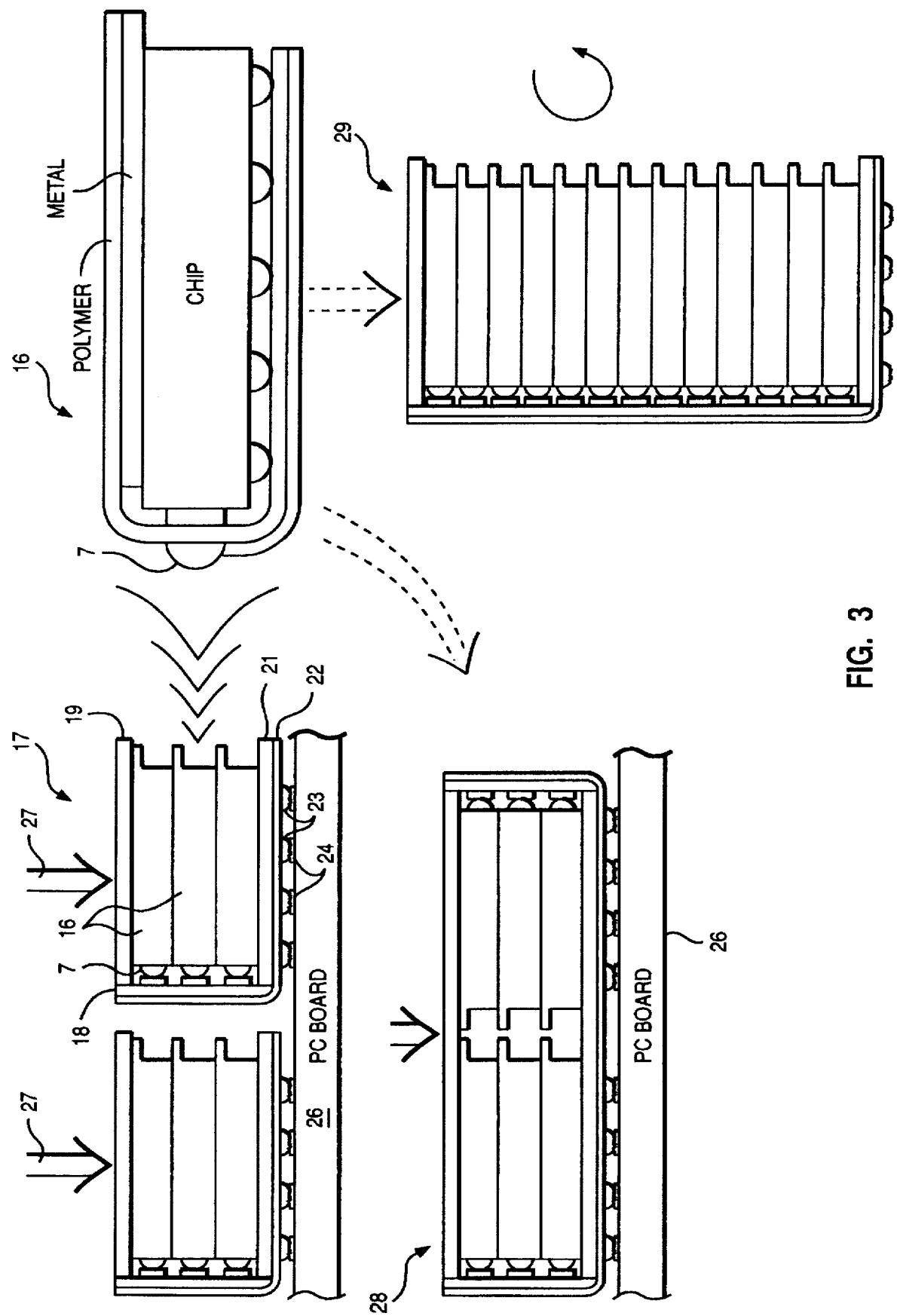
FIG. 3 schematically illustrates various forms of second level modules formed according to the present invention when using multiple first level modules.

The present invention is directed to the integration of multiple first level modules fabricated according to the teaching in U.S. Pat. No. 5,229,916 into second and heirarchically greater levels of multiple chip module structures which can be selectively configured to exhibit high or low aspect ratios while retaining the high packaging density and heat dissipation capabilities characterizing the first level module. The diversity of use is schematically illustrated in FIG. 3. As shown in FIG. 3, first level module 16 forms one of multiple elements in a relatively low aspect ratio second level multiple chip module 17. As embodied in FIG. 3, second level module 17 has three first level modules 16 connected by contacts 7 to a conductive interconnect pattern on printed circuit board or the like 18. Upper and lower stiffeners, respectively 19 and 21, are bonded to board 18. Another polymer 22 is wrapped and bonded as an aspect of the second level module structure 17. Polymer 22 again includes an interconnect pattern of copper so as to define a reorientation of the wiring plane from that of contacts 7 to that of contacts 23.

Second level multiple module contacts 23 are shown electrically connected to patterned copper pads 24 of printed circuit board 26. The connections between contacts 23 and pads 24 may be accomplished in numerous different ways. The simplest example involves the use of reflowed solder. More advanced techniques utilize dendrites formed in the manner described in U.S. Pat. No. 5,137,461, the subject matter of which is incorporated herein by reference. The dendrites may be formed on either contacts 23 or pads 24, or both. Preferably one surface would have the dendrites while the other would be composed of a soft, low melting point solder. In such a practice, the application of force 27 on module 17 would produce an electrical connection by metalurgical bond between the dendrites on one surface and the soft solder deposit on the opposite compressed surface.

A further variation of structures and methods suitable to electrically connect contacts 23 of module 17 with pads 24 of printed circuit board 26 involves the use of a dendrite interposer, where contacts 23 and pads 24 are both composed of solder and the interposer is situated therebetween. The interposer body is composed of a thin and flexible dielectric with vias aligned to match the pattern of the contacts and pads. The outer surfaces of the vias are covered with plated dendrites. Examples of dendritic interposers are described in two IBM Technical Disclosure Bulletins. The first is entitled "Double-Sided, Replaceable, Dendrite-Plated Interposer for Connector Applications" as appeared in Volume 37, No. 10, Oct. 1994, pp. 35–36. The second appeared in the earlier publication entitled "Interposer for Direct Chip Attach or Surface Mount Array Devices", Volume 36, No. 7, Jul. 1993 on pp. 137–138. The subject matter of both references is incorporated herein by reference. The use of an interposer simplifies removal of modules, but complicates the overall structure in that a socket is likely to be needed to maintain a reliable electrical connection in the presence of thermal and mechanical stresses. A preferred socket is described in copending U.S. patent application Ser. No. 08/536,880, filed Sep. 29, 1995, the subject matter of which is incorporated herein by reference.

Consideration of second level module 17 shows that the use of polymer with a copper interconnect pattern again facilitates reorientation of the contact plane. Namely, the plane begins with the pads of the integrated circuit chip, is rotated orthogonally to lie coplanar with contacts at the edge of the chip, and then is further reoriented orthogonally to again lie coplanar with the chip pads. This reorientation of the connections from module level to module level allows for a selective control of the module aspect ratio. For example, module 17 is relatively dense yet exhibits a relatively low aspect ratio. Module 28, similar to module 17, contains the low aspect ratio with a merged configuration equivalent to two modules 17. Note that the cooling surfaces of the heat spreaders remain exposed to impinging airflow through the multiple module levels. Module 28 is also connected using force 27 if dendrites are utilized to connect the contacts of module 28 with the pads of printed circuit board 26.

The flexibility in defining the aspect ratio is further illustrated in high aspect ratio second level multiple chip module 29. The same structural concepts are applied and benefits gained, but in this case the objective is to create a high aspect ratio multiple chip configuration.

Figure 4:
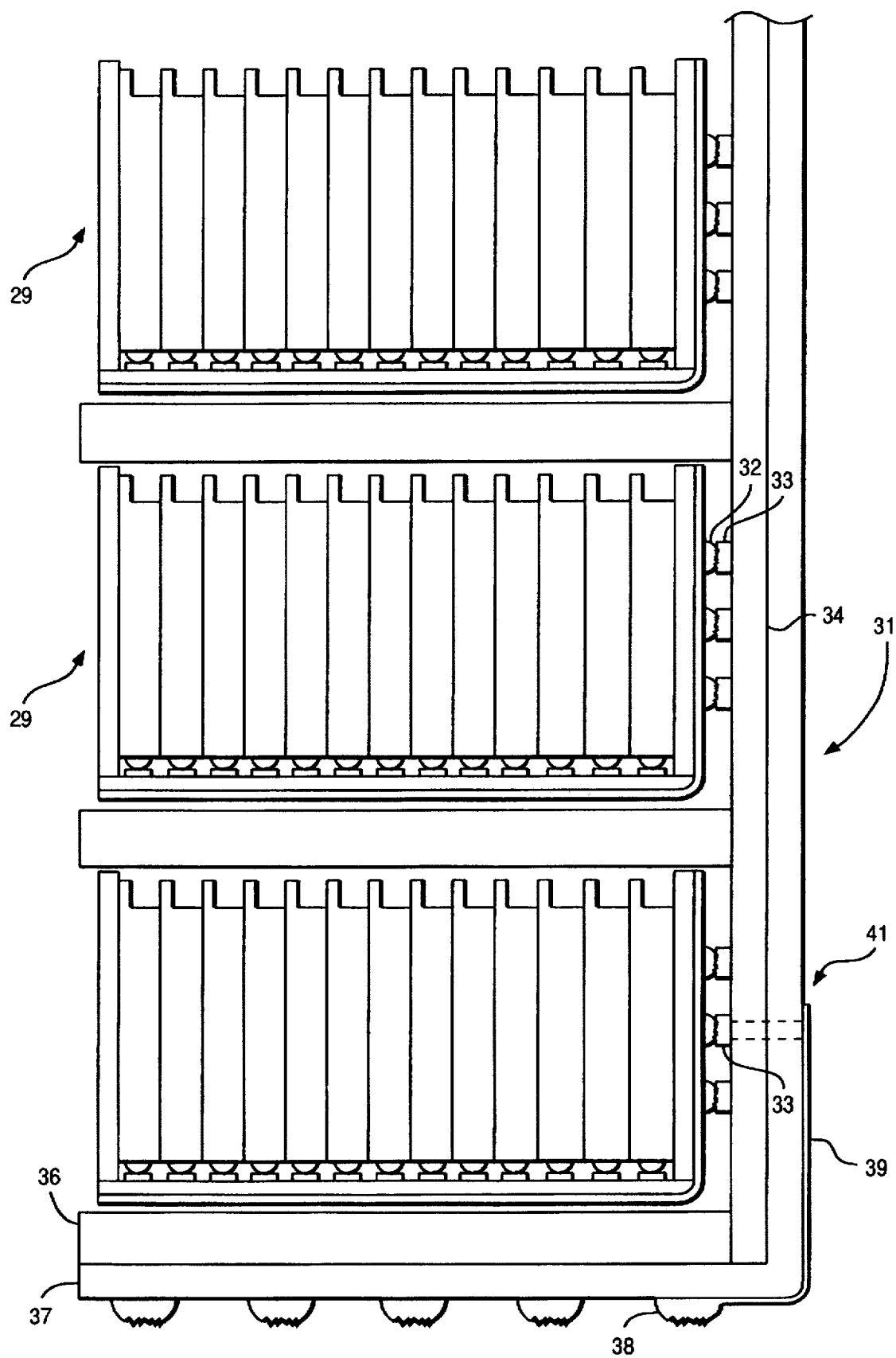
FIG. 4 schematically illustrates a third hierarchical level module composed of multiple second level modules.

FIG. 4 illustrates that high aspect ratio multiple chip module 29 lends itself to further levels of integration through an extension of the same heirarchical concept. The third level module 31 in FIG. 4 includes a multiplicity of second level multiple chip modules 29, and is itself further amenable to higher levels of integration in like manner. Contacts 32 of second level module 29 are electrically connected to pads 33 of printed circuit board base structure 34. Support walls 36 may be added by bonding to printed circuit board 34 to isolate and support the third level module. Again, a flexible polymer 37 is used to reorient the plane of the wiring connection from being coplanar with the pads of the integrated circuit chips to a plane orthogonal thereto. Contacts 38 of third level module 31 are connected to the pads 33 using plated copper runs 39 and via structures 41.

The present invention in its various forms and practices provides a structural and procedural framework for creating multiple chip modules at multiple levels of integration and with selectively defined aspect ratios as may be necessary for the data processing system. The invention incorporates elements for heat dissipation and structural support as needed for the silicon integrated circuit chips. Lastly, the invention efficiently and effectively utilizes new technologies, such as the dendrite interconnection and flexible low dielectric polyimid interconnects, to create a dense but serviceable multiple chip module structure.

The invention has been described and illustrated by way of specific embodiments, the systems and methods encompassed by the invention should be interpreted to be in keeping with the breath of the claims set forth hereinafter.

I claim:

1. A method for fabricating a multiple chip module, comprising the steps of:

enclosing multiple first level modules within a second support media, the first level modules characterized in their having:
a first support media enclosing a chip to electrically route chip input/output connections from a first plane, defined by pads on the chip, to a second plane, orthogonal to the first plane; and
first contacts distributed in the second plane on the first support media;

bending the second support media to route connections with the first contacts of the multiple first level modules in the second plane to positions coplanar with the first plane;

orienting second contacts on the second support media of the second level module to be coplanar with the first plane;

enclosing multiple second level modules within a third support media;

bending the third support media to route connections with the second contacts of the multiple second level modules situated coplanar with the first plane to positions coplanar with the second plane; and orienting third contacts on the third support media of the third level module to be coplanar with the second plane.

2. The method recited in claim 1, wherein the second support media is composed of a flexible polymer having an attached pattern of electrical wiring.

3. The method recited in claim 2, wherein the step of enclosing multiple first level modules within the second support media concludes with a connection between first contacts of the first support media and the pattern of electrical wiring on the second support media through solder.

4. The method recited in claim 2, wherein the step of enclosing multiple first level modules within the second support media concludes with a connection between first contacts of the first support media and the pattern of electrical wiring on the second support media by dendrites.

* * * * *